United States Patent [19]

Hayakawa

[11] Patent Number: 5,196,369
[45] Date of Patent: Mar. 23, 1993

[54] METHOD OF PRODUCING A LIGHT EMITTING DIODE ARRAY DEVICE

[75] Inventor: Toshiro Hayakawa, Yokohama, Japan

[73] Assignee: Eastman Kodak Company, Rochester, N.Y.

[21] Appl. No.: 676,652

[22] Filed: Mar. 28, 1991

[30] Foreign Application Priority Data

Mar. 30, 1990 [JP] Japan .................................. 2-84731

[51] Int. Cl.$^5$ ........................................... H01L 21/20
[52] U.S. Cl. ................................... 437/128; 437/127; 437/905; 437/906; 148/DIG. 99
[58] Field of Search ................ 437/127, 128, 51, 905, 437/906; 148/DIG. 99

[56] References Cited

U.S. PATENT DOCUMENTS

| | | | |
|---|---|---|---|
| 3,817,798 | 6/1974 | Jacobus, Jr. et al. | 437/905 |
| 4,008,485 | 2/1977 | Miyoshi et al. | 437/905 |
| 4,404,730 | 9/1983 | Heimen | 437/905 |
| 4,755,485 | 7/1988 | Tsai | 437/905 |

OTHER PUBLICATIONS

A. Shima, et al.; Extended Abstract of the 21st Conference on Solid State Devices and Materials; Tokyo, 1989, pp. 345-348.

Primary Examiner—Brian E. Hearn
Assistant Examiner—Linda J. Fleck
Attorney, Agent, or Firm—Raymond L. Owens

[57] ABSTRACT

A method of fabricating light emitting diode array devices is provided, said method comprising the steps of layering through crystal growth the second semiconductor layer with an impurity serving as the diffusion source on the first semiconductor layer, removing by etching the area of said second semiconductor layer other than the island-like area at the location corresponding to the location where light emitting diodes are to be formed, and diffusing said impurity on said first semiconductor layer from said island-like area as the diffusion source. According to this method, such complicated process as gaseous phase diffusion, depositing ZnO film as the diffusion source, etc. may be eliminated.

6 Claims, 4 Drawing Sheets

1

METHOD OF PRODUCING A LIGHT EMITTING DIODE ARRAY DEVICE

FIELD OF THE INVENTION

The present invention relates to a method of fabricating light emitting diode array devices or more particularly, to a method of fabricating of light emitting diode array devices impurity diffusion type which comprise a plurality of light emitting diode arrays closely arranged on the same substrate and adapted to be used for example in the printing light source for an optical printer.

DESCRIPTION OF PRIOR ARTS

Light emitting array devices comprising a plurality of pn junction or pin junction light emitting diodes closely arranged on the same substrate are capable of relatively easily processing image information or the like by controlling the respective light emitting diodes. In view of the advantages of such light emitting diode array devices, various improvements as well as applications thereof are being considered.

For example, in the field of printers as a means of outputting information, with the advent of the so-called information-oriented society in the recent years, the volume of information which has to be treated has greatly increased and the quality of such information has also changed to include image information such as graphs, drawings, pictures and the like. In order to cope with the change taking place in the type of information to be processed, a capacity to deal with a higher volume of information at higher speed is being required of information processing devices. It is known that a light emitting diode array device is used as a light source for the purpose of solving the above-mentioned requirement.

More specifically, a laser printer employing a laser as a light source and an LED printer employing light emitting diode array devices as the light source are known as a non-impact type optical printers. While the former laser printer necessitates a mechanical mechanism such as a polygon mirror or the like which is rotatable for scanning the laser beam and a complicated optical system corresponding to the such mechanical mechanism, the latter LED printer has only to electrically control the respective light emitting diodes (to be hereinafter referred to as "light emitting element") consisting of a plurality of light emitting diodes for the intended purpose and as a consequence, require no mechanical moving part. Instead it may employ a simple eye lens of equal magnification in the optical system. Therefore, an LED printer has such advantages as it can be made more compact, attain a higher speed and be more reliable than a laser printer.

FIG. 1 is the sectional view of the light emitting diode array device of GaAsP type for a conventional LED printer. For simplicity of illustration, two of those light emitting diodes are shown in FIG. 1.

In FIG. 1, the respective light emitting elements are constituted in such a manner as n-GaAsP layer 62 (having the thickness of approximately 50 μm) is layered by means of a VPE method on the n-GaAs substrate 61, Zn diffusion is then carried out with SiN film 64 as the mask to form the Zn diffused area 63 (having a thickness of approximately 2 μm) and the boundary surface between the n-GaAsP layer 62 and Zn diffused area 63 will become pn junction surface. Thus light emitting elements are provided. Then the p-electrode 66 and n-electrode 67 are formed. Subsequently the reflection preventing SiN film 65 will be coated thereon. The portion of the area of the SiN film which is spaced from the light emitting elements will be later removed to form the bonding pad for the p-electrode 66.

According to the process of fabricating such light emitting diodes as described above, Zn diffusion process is the significant part of the process and the characteristics of the diffusion area decide the characteristics of the light emitting diodes. According to the conventional Zn diffusion process, the temperature of ZnAs$_x$ serving as the diffusion source was controlled in the range of diffusion over which it is capable of independently controlling the temperatures in more than two zones, so that the Zn vapor pressure in the atmosphere was controlled and Zn density on the material was thereby controlled. The temperature of the material on which Zn is diffused was controlled independently of control of the Zn density whereby the rate of Zn diffusion was varied.

Another attempt has also been made as a method of fabricating light emitting diodes to deposit in advance a thin film of ZnO film or the like as the diffusion source on the material, apply a protective film of SiO or SiNx additionally on the material so as to prevent Zn or As from escaping therefrom and then to heat the material in a diffusion oven. (See ex. reference; A. Shima, T. Kamizato, A. Takami, S. Karakida, K. Isshiki, H. Matsubara, and H. Kumeda, Extended Abstract of the 21st conference on Solid State Devices and Materials, Tokyo, 1989, pp. 345-348)

SUMMARY OF THE INVENTION

However, such processes according to the prior arts for fabricating light emitting diode array devices as gaseous phase diffusion involve complicated fabrication process, because a great deal of As is used in the diffusion oven, the reaction tube is easily deteriorated and maintenance thereof is troublesome, temperature control of two zones is not easy, and As has to be pressurized so as to prevent As from escaping from the crystal surface. It is understood that the light emitting efficiency of the light emitting elements is normally maximum with the impurity being in the order of $1 \times 10^{18}$ cm$^{-3}$ at the location adjacent the pn junction. However, according to the processes of a prior art, the density of Zn which has been diffused normally has to be extremely high such as between $10^{19}$ to $10^{20}$ cm$^{-3}$, which results in an extremely low efficiency light transmission.

Further according to the prior art process as described above in which the ZnO film or the like serving as the diffusion source is deposited in advance on the material, then covered by the protective film of SiO or SiNx so as to prevent Zn and As from escaping, and subsequently heated in a diffusion oven so as to diffuse Zn, although such advantages as the elimination of the need for an As atmosphere as well as control of temperature in more than two zones may be provided, an additional step of depositing the diffusion film and the protective film is required, and since the impurity to be diffused constitutes of the diffusion source, the surface density of the impurity to be diffused will eventually increase, making it impossible to lower the Zn density and increase the light emitting efficiency of the light emitting elements.

The present invention has been proposed in consideration of the problems relating to the method according to prior arts of fabricating light emitting diode array devices and has it as an object to provide a method of fabricating light emitting array devices which simplifies the impurity diffusion process in the process of fabrication of light emitting diode array device so that production efficiency and homogeneity of the products may be enhanced and the impurity density at the pn junction may be reduced at the same time, whereby the light emitting efficiency of the light emitting elements may be enhanced.

According to the present invention, there is provided a method of fabricating light emitting diode array devices formed with a plurality of light emitting diodes at desired locations on a substrate, the method being characterized in comprising the steps of layering by means of crystal growth on a substrate at least the first semiconductor layer having the first conductive pattern and the second semiconductor layer having the second conductive pattern which is different from the first semiconductor layer and has an impurity having a high density serving as a diffusion source added thereto, removing by etching the portion of the layered second semiconductor layer other than the island-like portion corresponding to the location where the light emitting diodes are to be formed and diffusing the impurity onto the first semiconductor layer from the island-like area as the diffusion source to form the pn junction.

The present invention is also characterized by including the step of removing by etching the portion of the island-like area except for the portion for providing ohmic contact with the electrode after the step of forming the pn junction.

The first semiconductor layer may be formed by use of n-GaAs while the second semiconductor layer may be formed by use of p+-GaAs.

The first semiconductor layer may also be formed with n-AlGaAs and the second semiconductor layer may also be formed with p+-GaAs.

The first semiconductor layer may also be formed with n-AlGaAs and the second semiconductor layer may also be formed with p+AlGaAs.

The first semiconductor may further be formed with n-GaAs and the second semiconductor may be formed with p+AlGaAs.

According to the present invention, since the impurity may be diffused on the first semiconductor layer by using as the main process the steps of forming through crystal growth the first semiconductor layer and the second semiconductor layer with a high density of impurity added thereon which is to serve as the diffusion source, and removing by etching the portion of the second semiconductor layer other than the island-like area corresponding to the location where the light emitting diodes are to be formed, such complicated steps such as those of gaseous phase diffusion of impurities, depositing a ZnO film serving as the diffusion source, and the like required in the conventional process may be eliminated.

Further, since the island-like area which serves as the diffusion source is formed by selectively removing by etching the second semiconductor layer with a high density of impurity added thereon, diffusion density of the impurity onto the diffusion area of the first semiconductor layer may be precisely controlled by controlling the density of the impurity added to the second semiconductor in the course of crystal growth thereof.

Furthermore since the second semiconductor layer with a high density of impurity as the diffusion source added thereon has a metallic characteristic in itself, as required after the impurity has been diffused in the first semiconductor layer from the island-like area, the island-like area is removed by etching except for the portion for providing ohmic contact with the electrode, whereby the ohmic contact for the light emitting area may be easily provided.

A preferred embodiment of the present invention will now be described by referring to the accompanying drawings wherein;

DESCRIPTION OF A PREFERRED EMBODIMENT

Figure 1:
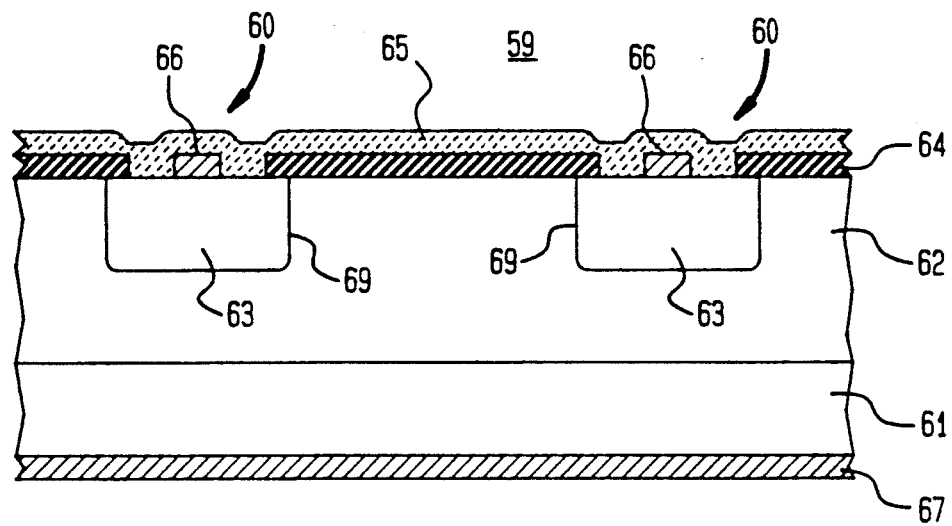
FIG. 1 is a typical sectional view of the light emitting diode array device of GaAsP type for explaining a conventional method of producing the light emitting diode array device.
Figure 2:
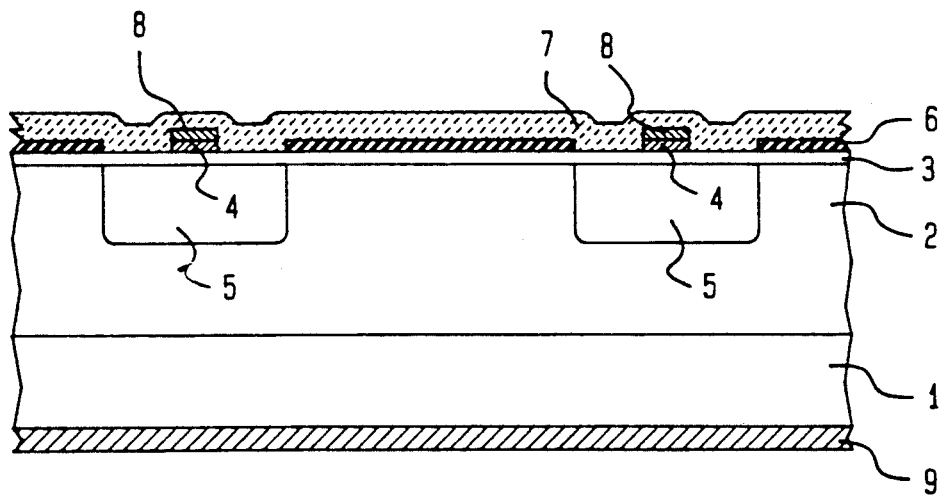
FIG. 2 is a typical sectional view of the light emitting diode array device of GaAs type as produced by the first embodiment of the present invention.

FIG. 2 is a typical sectional view of the light emitting diode array device of GaAs type fabricated in accordance with the first embodiment of the present invention. In the light emitting diode array device shown in FIG. 2, n-GaAs 2 (having the thickness of approximately 50 μm) is layered on n-GaAs substrate 1 and the island-like Zn diffused area 5 (having the thickness of approximately 2 μm) is formed by diffusing Zn with SiNx film 6 as the masking means. The boundary surface between the n-GaAs 2 and Zn diffused area 5 provides pn junction for the light emitting diode. Furthermore, p-electrode 8 and n-electrode 9 are respectively formed. The portion of the SiN film 7 provided with a reflection preventive coating which is spaced from the light emitting element is removed to form the bonding pad for p-electrode 8. Numeral 3 designates n-AlGaAs which serves as the etching terminating layer, and numeral 4 designates p+-GaAs for providing ohmic contact with p-electrode 9.

Figure 3A:
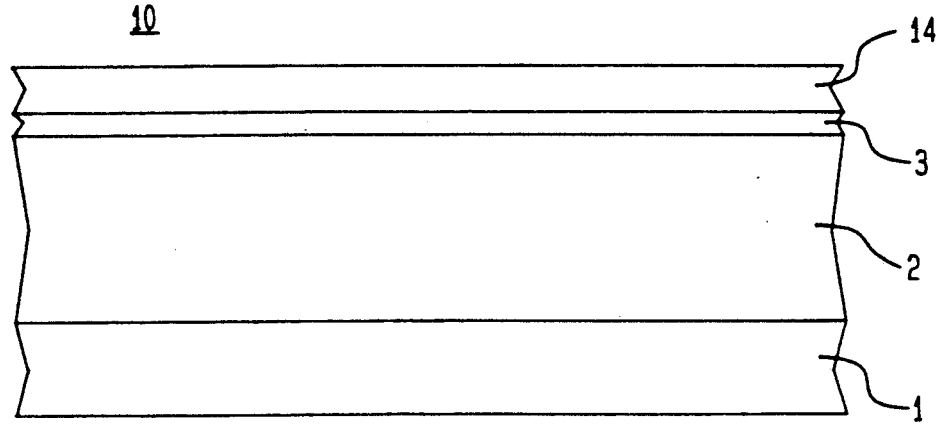
FIG. 3(a) through (f) are typical sectional views for respectively explaining the respective steps of the first embodiment.
Figure 3B:
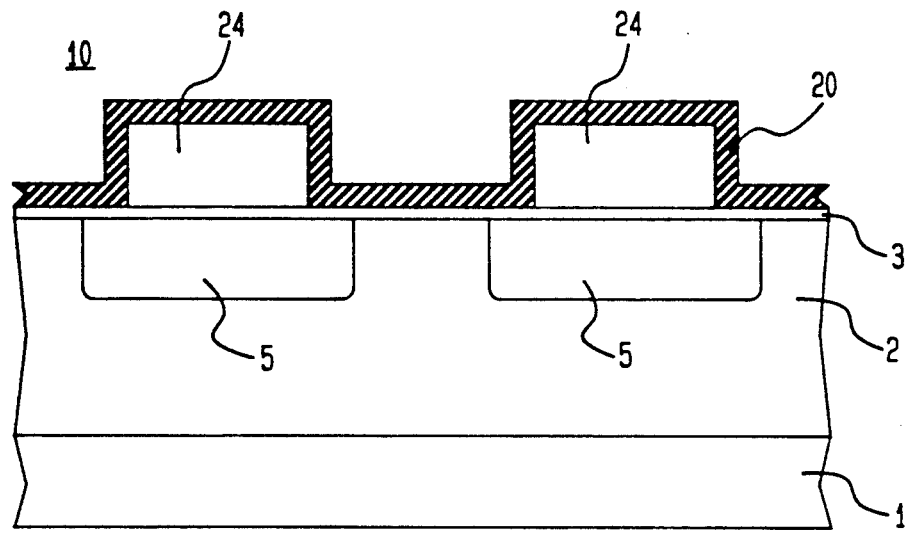
Figure 3C:
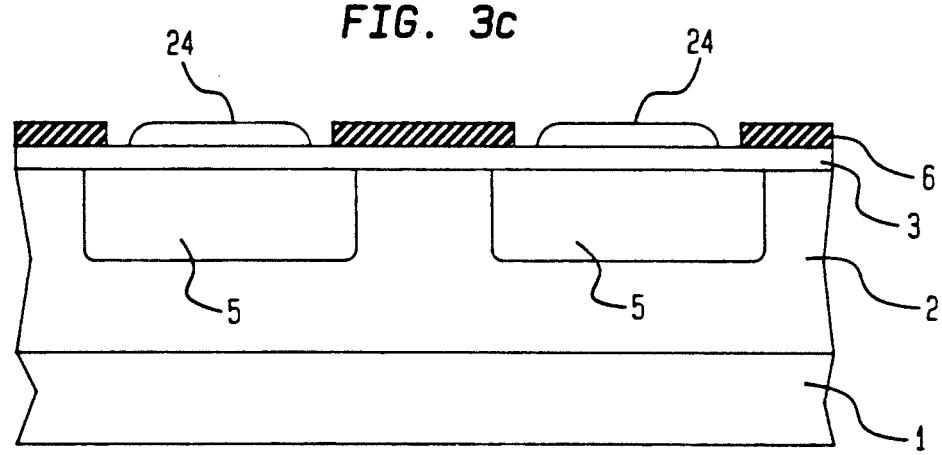
Figure 3D:
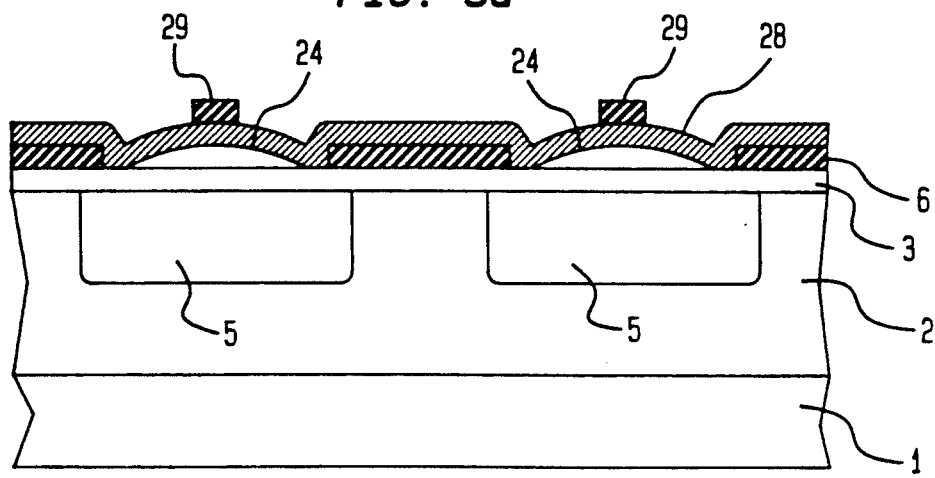
Figure 3E:
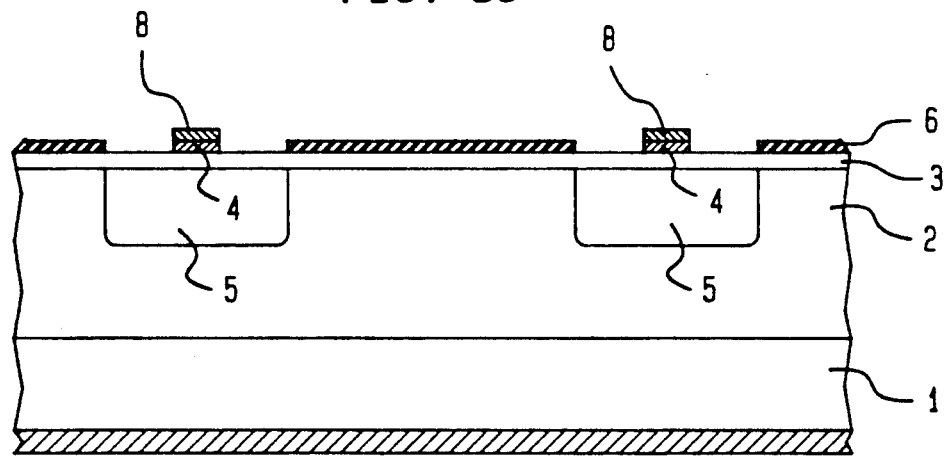
Figure 3F:
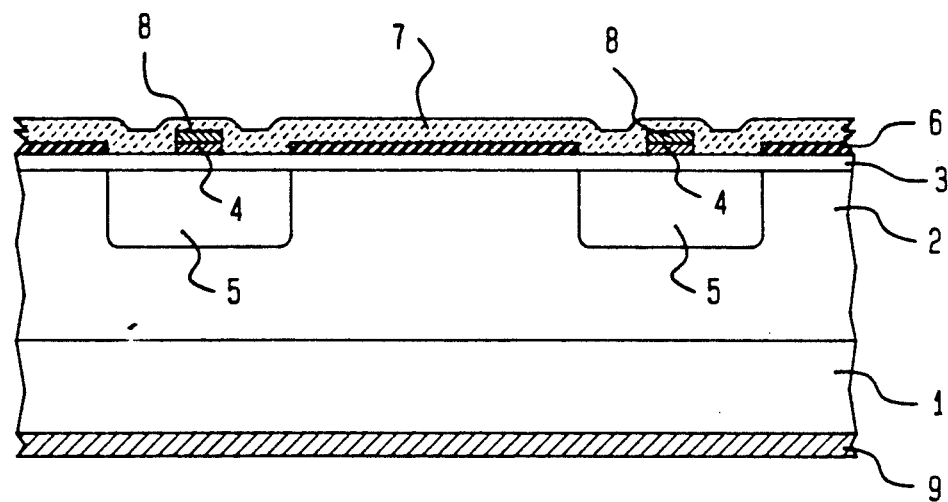

The process of fabricating the GaAs light emitting diode array device according to the first embodiment of the present invention will next be explained by referring to FIGS. 3(a)–(f). As shown in FIG. 3(a), on the substrate 1 of n-GaAs there are layered the following layers in the following order by use of MOCVD method; n-GaAs 2 (S density = $5 \times 10^{17}$ cm$^{-3}$, thickness 20 μm), n-Al$_{0.3}$Ga$_{0.7}$As 3 (S density = $5 \times 10^{17}$ cm$^{-3}$, thickness 200 Å) p+-GaAs 14 (Zn density = $10^{20}$ cm$^{-3}$, thickness 1.5 μm). As shown in FIG. 3(b), p+-GaAs 14 is etched by a photolithographic method to leave the area corresponding to the location at which the light emitting elements are formed to provide island-like areas 24. At this time, it is possible to selectively remove p+-GaAs 14 with n-Al$_{0.3}$Ga$_{0.7}$As 3 serving as the etching terminating layer by use of the etchant comprising a mixture of NH$_4$OH, H$_2$O$_2$ and H$_2$O; so that uniformity of the process may be enhanced. subsequently, SiNx film 20 will be formed entirely over the island-like areas 24 and n-Al$_{0.3}$Ga$_{0.7}$As 3 as their protective film by use of plasma CVD method and then the composite layer is further heated in an oven to a temperature of 600°-800° C. to form a Zn diffused area 5 in n-GaAs 2. Then as shown in FIG. 3(c), by use of photo-lithographic method, the portion of SiNx film 20 (see FIG. 3(b)) which covers the island-like area of p+-GaAs is etched by plasma to leave the area 6 which does not cover the island-like area. Subsequently by using the etchant comprising a mixture of NH$_4$OH, H$_2$O$_2$ and H$_2$O, the island-like area 24 is etched to the thickness of 0.1-0.2 μm. Then as shown in FIG. 3(d), Al 28 is deposited for forming p-electrode 8 (see FIG. 2). Photoresist 29 will then be formed on the Al 28, by use of a photo-lithographic method at the area for providing ohmic contact of the light emitting area and the area for providing wiring for outside of the light emitting area and the bonding pad. Then as shown in FIG. 3(e), Al 28 on areas other than that for providing ohmic contact is removed by use of a chemical etchant derived from the phosphrous family or alternatively a dry etchant to form p-electrode 8. Further by using the etchant comprising a group of NH$_4$OH, H$_2$O$_2$ and H$_2$O, the island-like area (p+-GaAs) 24 (see FIG. 3(d)) is etched to leave the area other than the one 4 for providing ohmic contact. The photoresist 29 (see FIG. 3 (d)) is also removed. Finally as shown in FIG. 3(f), SiNx film 7 (1190 Å) serving as the reflection protective film is formed over the entire. After the rear surface of n-GaAs substrate 1 is ground, AuGe/Ni/Au is deposited and n-electrode 9 is formed by heat treatment. At this time, due to the heat treatment, a good ohmic contact may be provided also between Al 8 at n-side and p+-GaAs 4. After that, SiNx film 7 is selectively removed by plasma etching by use of photo-lithography method so as to form the area which will serve as a bonding pad and the surface of Al 8 for wire bonding is exposed.

According to the present embodiment of the invention, since the diffusion process in the gaseous phase for diffusion of an impurity which is difficult to handle as required in the conventional process and the process of depositing a ZnO film or the like serving as the diffusion source may be dispensed with and, MOCVD method and chemical etching which are relatively easy to control may be employed as the principal process so that Zn diffusion may be executed very simply. Furthermore, in the process of layering p+-GaAs by use of MOCVD method (see FIG. 3(a)), the density of Zn to be added to p+-GaAs 14 may be precisely controlled, and the Zn density in p+-GaAs 14 may be controlled to be approximately 10$^{20}$ cm$^{-3}$ which is lower than in the case of a conventional method. Accordingly the Zn density in the Zn diffused area 5 in n-GaAs 2 may be controlled to be around 10$^{18}$ cm$^{-3}$ which is optimum with regard to light emitting efficiency. Further, since the island-like area 24 which serves as the Zn diffusion source has the metallic characteristic in itself, the ohmic electrode can be easily provided by using the etchant to remove the area so as to leave the area for providing an ohmic contact with the electrode.

It is to be noted in the first embodiment as above described that forming Zn doped GaAs 14 in the form of an island-like area 24 and selectively diffusing Zn constitutes an essential part of the present invention, and various alternatives may naturally be employed as to the crystal growth method and the etching method. It is also possible to employ Be, Mg, Cd and the like other than Zn as the impurity. It is further possible that the substrate and the ground semiconductor layer are made as a p type and the impurity of an n type may be selectively diffused from the semiconductor layer heavily doped with S, Se, Te or the like.

Figure 4:
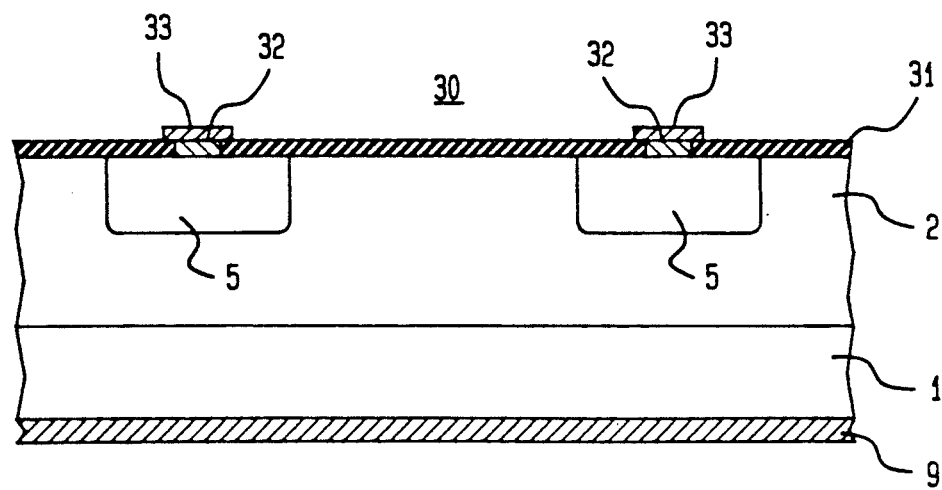
FIG. 4 is a typical sectional view of the light emitting diode array device of GaAs type for explaining the second embodiment of the present invention.

FIG. 4 is a typical sectional view for explaining the method of fabricating a GaAs light emitting diode array device according to the second embodiment of the present invention. It is to be noted in FIG. 4 that such portions common to those shown in FIG. 2 and FIG. 3 are designated by the identical numerals as employed in FIG. 2 and FIG. 3. According to the second embodiment, up to the process shown in FIG. 3(b), the same process will be executed as the one in the first embodiment. Then SiNx film 20, the island-like area (p+-GaAs) 24, and n-Al$_{0.3}$Ga$_{0.7}$As 3 shown in FIG. 3(b) are successively etched to be removed. It is to be noted here that the last n-Al$_{0.3}$Ga$_{0.7}$As 3 for example may be selectively so etched by use of chemical etching of HF family that the ground n-GaAs 2 may be made as the etching terminating layer. Then, SiNx film 31 (having the thickness of 1190 Å) serving as the insulating layer for the reflection protective film, the wiring and the semiconductor is entirely formed. Subsequently, the photoresist which becomes the portion to be a p-electrode on the light emitting element is provided by use of photo-lithographic method and after AuZn is deposited all over, the AuZn 32 only at the photoresist remains by lifting-off. Subsequently, the bar side surface is deposited with an n-electrode 9 and the p-electrode and n-electrode 9 thus provide ohmic contact. Finally, an Au film 33 is formed at the area which serves for wiring and bonding pad.

Figure 5:
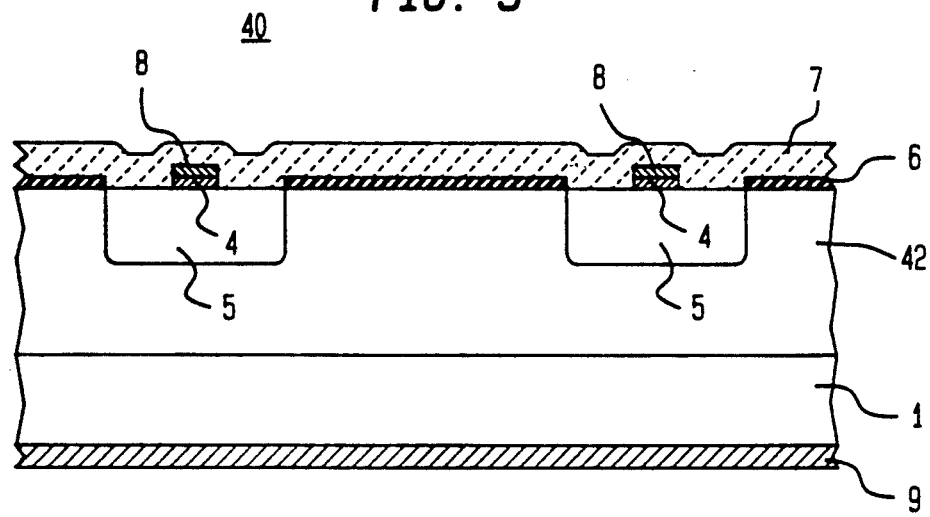
FIG. 5 is a typical sectional view of the light emitting diode array device of AlGaAs type for explaining the third embodiment of the present invention.

FIG. 5 is a typical sectional view for explaining the method of fabricating the light emitting diode array devices of AlGaAs type according to the third embodiment of the present invention. According to this third embodiment, on the n-GaAs substrate 1, there are layered by the MOCVD method the layers of n-Al$_{0.25}$G$_{0.75}$As 42 (Si Density 5×10$^{17}$ cm$^{-3}$, thickness of 15 μm). and p+-GaAs 4 (Zn density = 10$^{20}$ cm$^{-3}$, thickness of 1.5 μm). Subsequently by using the same process as that applied in the first embodiment, Zn is diffused from the layer of p+-GaAs 4 formed in an island-like shape to n-AlGaAs 42 to fabricate light emitting diode array devices. The difference between the first and second embodiments resides in the fact that etching can be terminated at the boundary surface with n-AlGaAs 42 without using any other etching termination layer at the time of forming an island-like area of p+-GaAs 4.

Figure 6:
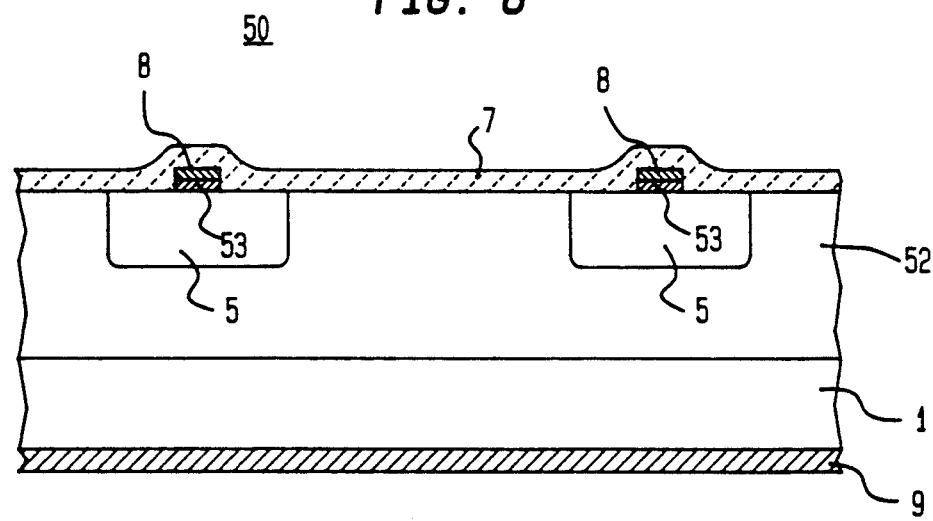
FIG. 6 is a typical sectional view of the light emitting diode array of AlGaAs type for explaining the fourth embodiment of the present invention.

FIG. 6 is a typical sectional view for explaining the method of fabricating light emitting diode array devices of AlGaAs type according to the fourth embodiment of the present invention. According to this fourth embodiment, on the substrate 1 of n-GaAs, there are layered by use of MOCVD method the layers of n-Al$_{0.2}$Ga$_{0.8}$As 52 (S density = 8×10$^{17}$ cm$^{-3}$, thickness 15 μm), n-GaAs (S density = 8×10$^{17}$ cm$^{-3}$, thickness 0.1 μm) and p+Al$_{0.3}$Ga$_{0.7}$As (Zn density = 10$^{20}$ cm$^{-3}$, thickness 2.0 μm). Subsequently by using a chemical etching process of the HF family, the layer of p+-AlGaAs is selectively removed with n-GaAs as the etching termination layer and the island-like area corresponding to the location where the light emitting elements are formed. Then after having executed the diffusion process has been executed, p-GaAs 53 which has become a p-type as the result of the diffusion process is left to provide ohmic contact.

Figure 7:
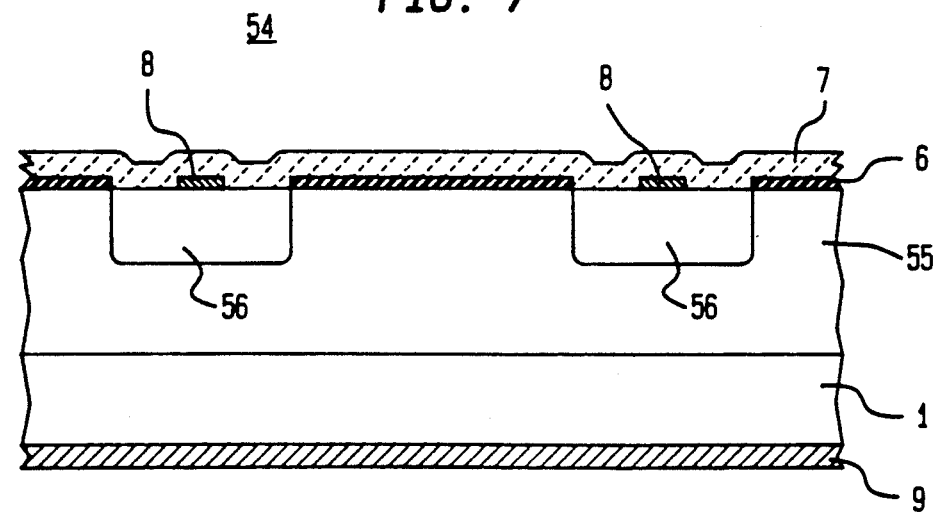
FIG. 7 is a typical sectional view of the light emitting diode array device of AlGaAs type for explaining the fifth embodiment of the present invention.

FIG. 7 is the typical sectional view for explaining the method of fabricating light emitting diode array devices of AlGaAs type according to the fifth embodiment of the present invention. According to this fifth embodiment, on the substrate 1 of n-GaAs, there are layered by use of the LPE method the layers of n-GaAs (Si density $=3 \times 10^{17}$ cm$^{-3}$, thickness of 20 $\mu$m) 55 and p$^+$-Al$_{0.3}$Ga$_{0.7}$As (Zn density $=5 \times 10^{19}$ cm$^{-3}$, thickness of 2 $\mu$m). Subsequently, p$^+$-Al$_{0.3}$Ga$_{0.7}$As is selectively etched by use of a chemical etching method of the HF family with n-GaAs serving as an etching terminating layer to leave an island-like area at the location corresponding to the location where a light emitting element is to be formed. After having applied the diffusion process, p$^+$-Al$_{0.3}$Ga$_{0.7}$As, which has been used for diffusion is to be removed and an ohmic electrode is formed on the surface of p-GaAs 56 which is now a p type as the result of Zn diffusion.

As explained above, the present invention eliminates the need for such a gaseous phase diffusion process which requires the application of a gaseous phase diffusion which is difficult to control for the purpose of diffusing an impurity as well as eliminating the need for an additional process of depositing a ZnO film or the like as a diffusion source. Instead, the present invention employs relatively easy to control crystal growth and etching processes as the principal processes, so that any impurity may be relatively easily diffused to form a pn junction. Consequently, the fabrication process of diffusion type light emitting diode array devices may be simplified and production efficiency and uniformity of products enhanced.

Further, since the second semiconductor layer which has the second conductive pattern and impurity added thereto may enable the density of impurity to be precisely controlled at the time of crystal growth, the density of impurity may therefore be relatively reduced compared to that of the conventional method. As a consequence, the density of an impurity at the impurity diffused area in the first semiconductor layer may be controlled to be in the order of $10^{18}$ cm$^{-3}$ which is optimum for light emitting efficiency.

Furthermore since the second semiconductor layer with an impurity densely added thereto to serve as a diffusion source has the metallic property in itself, an ohmic electrode may be very easily provided by etching the first semiconductor layer with an impurity diffused from the island-like area to leave an area to provide such an ohmic contact.

While there have been shown and described what are at present considered the preferred embodiments of the present invention, it will be obvious to those skilled in the art that various changes and modifications may be made without departing from the spirit and the scope of the invention as defined by the appended claims.

What is claimed:

1. A method of fabricating a light emitting diode array device in which a plurality of light emitting diodes are formed at desired locations on a substrate, said method comprising the steps of;
   depositing a first semiconductor layer having a first conductive pattern and a second semiconductor layer having a second opposite conductive pattern such second conductivity being provided by a heavily added second conductivity impurity serving as a diffusion source,
   removing by etching an area of said layered second semiconductor layer leaving island-like areas at locations corresponding to where the light emitting diodes are to be formed, and
   diffusing said impurity into said first semiconductor layer from said island-like areas to form a diffusion area, with the junction between the diffusion area and the first layer providing pn junctions.

2. A method of fabricating a light emitting diode array device as claimed in claim 1, further including the step of etching said island-like areas to leave a portion of each such area and forming an electrode on each such portion.

3. A method of fabricating a light emitting diode array devices as claimed in claim 1 wherein said first semiconductor layer is formed of n-GaAs while said second semiconductor is formed of p$^+$-GaAs.

4. A method of fabricating light emitting diode array devices as claimed in claim 1 wherein said first semiconductor layer is formed of n-AlGaAs while said second semiconductor layer is formed of p$^+$-GaAs.

5. A method of fabricating light emitting diode array devices as claimed in claim 1 wherein said first semiconductor layer is formed of n-AlGaAs while said second semiconductor layer is formed of p$^+$-AlGaAs.

6. A method of fabricating light emitting diode array devices as claimed in claim 1 wherein said first semiconductor layer is formed of n-GaAs while said second semiconductor layer is formed of p$^+$AlGaAs.

* * * * *